US011756871B2

(12) United States Patent
Chen et al.

(10) Patent No.: US 11,756,871 B2
(45) Date of Patent: Sep. 12, 2023

(54) FAN-OUT PACKAGING STRUCTURE AND METHOD

(71) Applicant: SJ SEMICONDUCTOR (JIANGYIN) CORPORATION, Jiangyin (CN)

(72) Inventors: Yenheng Chen, Jiangyin (CN); Chengchung Lin, Jiangyin (CN)

(73) Assignee: SJ SEMICONDUCTOR (JIANGYIN) CORPORATION, Jiangyin (CN)

(*) Notice: Subject to any disclaimer, the term of this patent is extended or adjusted under 35 U.S.C. 154(b) by 205 days.

(21) Appl. No.: 17/476,340

(22) Filed: Sep. 15, 2021

(65) Prior Publication Data
US 2022/0084925 A1 Mar. 17, 2022

(30) Foreign Application Priority Data

Sep. 15, 2020 (CN) .......................... 202010969175.9
Sep. 15, 2020 (CN) .......................... 202022013581.6

(51) Int. Cl.
*H01L 29/417* (2006.01)
*H01L 23/498* (2006.01)
(Continued)

(52) U.S. Cl.
CPC .... *H01L 23/49822* (2013.01); *H01L 21/4857* (2013.01); *H01L 23/49816* (2013.01); *H01L 24/16* (2013.01); *H01L 24/19* (2013.01); *H01L 24/20* (2013.01); *H01L 24/32* (2013.01); *H01L 24/73* (2013.01); *H01L 24/81* (2013.01); *H01L 24/83* (2013.01); *H01L 25/105* (2013.01); *H01L 2224/16227* (2013.01); *H01L 2224/32225* (2013.01); *H01L 2224/73204* (2013.01); *H01L 2224/73259* (2013.01);
(Continued)

(58) Field of Classification Search
CPC ... H01L 21/486; H01L 21/4857; H01L 21/56; H01L 2224/023; H01L 25/0657
USPC ................................................. 257/686, 774
See application file for complete search history.

(56) References Cited

U.S. PATENT DOCUMENTS 8,133,762 B2 * 3/2012 Pagaila ................. H01L 23/528
438/117
9,735,131 B2 * 8/2017 Su ........................... H01L 25/50
(Continued)

*Primary Examiner* — Nitin Parekh
(74) *Attorney, Agent, or Firm* — Alston & Bird LLP

(57) ABSTRACT

The present disclosure provides a fan-out packaging structure and a method for fabricating the fan-out packaging. The fan-out packaging structure includes a first redistribution layer, a second redistribution layer, metal connecting posts, a semiconductor chip, a first filling layer, a first packaging layer, a stacked chip package, a passive element, a second filling layer, a second packaging layer, and metal bumps. By means of the present disclosure, various chips having different functions can be integrated into one packaging structure, thereby improving the integration of the fan-out packaging structure. By means of the first redistribution layer, the second redistribution layer, and the metal connecting posts, a three-dimensional vertical stacked packaging is achieved. In this way, the integration level of the packaging structure can be effectively improved, and the conduction path can be significantly shortened, thereby reducing the power consumption, increasing the signal transmission speed, and increasing the data processing capacity.

4 Claims, 8 Drawing Sheets

(51) Int. Cl.
    *H01L 23/00*         (2006.01)
    *H01L 25/10*         (2006.01)
    *H01L 21/48*         (2006.01)

(52) U.S. Cl.
    CPC ............... *H01L 2224/73267* (2013.01); *H01L 2924/15174* (2013.01); *H01L 2924/19011* (2013.01)

(56) References Cited

U.S. PATENT DOCUMENTS

| | | | |
|---|---|---|---|
| 10,546,844 B2 * | 1/2020 | Kim | H01L 25/105 |
| 2012/0273960 A1 * | 11/2012 | Park | H01L 23/49827 257/774 |
| 2013/0062761 A1 * | 3/2013 | Lin | H01L 21/565 257/737 |
| 2014/0252646 A1 * | 9/2014 | Hung | H01L 25/0657 257/774 |
| 2016/0035709 A1 * | 2/2016 | Chen | H01L 23/3142 269/302 |
| 2016/0118333 A1 * | 4/2016 | Lin | H01L 22/20 257/773 |
| 2016/0329272 A1 * | 11/2016 | Geissler | H01L 23/49827 |
| 2018/0108638 A1 * | 4/2018 | Lin | H01L 23/3142 |
| 2018/0190581 A1 * | 7/2018 | Lin | H01L 23/5389 |
| 2018/0226364 A1 * | 8/2018 | Kim | H01L 23/585 |
| 2019/0333862 A1 * | 10/2019 | Wang | H01L 24/20 |
| 2020/0251456 A1 * | 8/2020 | Chen | H01L 25/50 |

\* cited by examiner

FAN-OUT PACKAGING STRUCTURE AND METHOD

CROSS REFERENCE TO RELATED APPLICATION

The present application claims the benefit of priority to Chinese Patent Application No. CN 2020109691759, entitled "FAN-OUT PACKAGING STRUCTURE AND METHOD", and Chinese Patent Application No. CN 2020220135816, entitled "FAN-OUT PACKAGING STRUCTURE", both filed with CNIPA on Sep. 15, 2020, the disclosures of which are incorporated herein by reference in their entirety for all purposes.

FIELD OF TECHNOLOGY

The present disclosure generally relates to semiconductor packaging, and in particular, to a fan-out packaging structure and method.

BACKGROUND

A more reliable and faster circuit having a higher density and lower cost is the goal of integrated circuit packaging. With the advent of the era of 5G communications and artificial intelligence, the amount of data to be transmitted and interactively processed by chips is relatively large, and demands generated by the mobile Internet and the Internet of Things (IoT) are increasingly stronger. Therefore, miniaturization and multi-functionalization of electronic terminal products are trending in the industry. How to integrate and package a plurality of high-density chips of different types to form a powerful system having low power consumption has become a major challenge in the field of advanced semiconductor chip packaging.

Fan-out wafer level packaging (FOWLP) has become one of the relatively advanced methods for fan-out packaging because to it has more input/output ports (I/O) and better integration flexibility. However, in the existing fan-out packaging technology, due to limited distribution accuracy, packages have relatively large area and thickness, and have numerous problems such as cumbersome processes and low reliability.

Therefore, it is necessary to provide a new fan-out packaging fan-out packaging structure and method.

SUMMARY the present disclosure provides a fan-out packaging method, comprising the following steps:

providing a support substrate, and forming a separation layer on the support substrate;

forming a first redistribution layer on the separation layer, where the first redistribution layer comprises a first surface in contact with the separation layer and a second surface opposite to the first surface;

forming a metal connecting post on the second surface of the first redistribution layer, where the metal connecting post is electrically connected to the first redistribution layer;

providing a semiconductor chip, where the semiconductor chip is located on the second surface of the first redistribution layer, a front side of the semiconductor chip is electrically connected to the first redistribution layer by a chip bonding pad, and a back side of the semiconductor chip is away from the second surface of the first redistribution layer;

filling a gap between the semiconductor chip and the first redistribution layer with a first filling layer;

packaging the first redistribution layer, the metal connecting post, and the semiconductor chip by a first packaging layer, where the metal connecting post is exposed from the first packaging layer;

forming a second redistribution layer on the first packaging layer, where the second redistribution layer comprises a first surface in contact with the first packaging layer and a second surface opposite to the first surface, and the second redistribution layer is electrically connected to the metal connecting post;

providing a temporary base, and bonding the temporary base to the second surface of the second redistribution layer;

peeling off the support substrate along with the separation layer to expose the first surface of the first redistribution layer;

performing laser etching on the first redistribution layer to expose a metal distribution layer in the first redistribution layer;

forming a metal bumps, where the metal bumps are electrically connected to the metal distribution layer exposed from the first redistribution layer;

providing a carrier, and removing the temporary base to expose the second surface of the second redistribution layer;

providing a stacked chip package and a passive element, where the stacked chip package and the passive element are located on the second surface of the second redistribution layer, and are both electrically connected to the second redistribution layer;

filling a gap between the stacked chip package and the second redistribution layer with a second filling layer;

packaging the second redistribution layer, the stacked chip package, and the passive element by a second packaging layer; and performing cutting to form a fan-out packaging structure.

Optionally, the stacked chip package comprises an embedded package on package (ePoP) memory.

Optionally, the passive element comprises one or more of a resistor, a capacitor, and an inductor.

Optionally, after the first redistribution layer is formed, the method further comprises a step of forming a UBM layer on the second surface of the first redistribution layer.

The present disclosure further provides a fan-out packaging structure. The fan-out packaging structure comprises:

a first redistribution layer, comprising a first surface and a second surface opposite to each other;

a second redistribution layer, comprising a first surface and a second surface opposite to each other;

a metal connecting post, located between the second surface of the first redistribution layer and the first surface of the second redistribution layer and electrically connected to the first redistribution layer and the second redistribution layer;

a semiconductor chip, located between the second surface of the first redistribution layer and the first surface of the second redistribution layer, where a front side of the semiconductor chip is electrically connected to the first redistribution layer by a chip bonding pad, and a back side of the semiconductor chip is away from the first redistribution layer;

a first filling layer, located between the semiconductor chip and the first redistribution layer and configured to fill a gap between the semiconductor chip and the first redistribution layer;

a first packaging layer, located between the second surface of the first redistribution layer and the first surface of the second redistribution layer and configured to cover the first redistribution layer, the metal connecting post, and the semiconductor chip;

a stacked chip package and a passive element, located on the second surface of the second redistribution layer and electrically connected to the second redistribution layer;

a second filling layer, located between the stacked chip package and the second redistribution layer and configured to fill a gap between the stacked chip package and the second redistribution layer;

a second packaging layer, configured to cover the second redistribution layer, the stacked chip package, and the passive element; and metal bumps, located on the first surface of the first redistribution layer and electrically connected to the first redistribution layer.

Optionally, the stacked chip package comprises an ePoP memory.

Optionally, the passive element comprises one or more of a resistor, a capacitor, and an inductor.

Optionally, a thickness of the first redistribution layer is greater than a thickness of the second redistribution layer.

Optionally, the first packaging layer comprises one of an epoxy resin layer, a polyimide layer, and a silica gel layer; the second packaging layer comprises one of an epoxy resin layer, an polyimide layer, and an silica gel layer; the first filling layer comprises one of an epoxy resin layer, a polyimide layer, and a silica gel layer; and the second filling layer comprises one of an epoxy resin layer, a polyimide layer, and a silica gel layer.

Optionally, the metal bumps comprise one of a copper bump, a nickel bump, a tin bump, and a silver bump.

As described above, by means of the fan-out packaging structure and the fan-out packaging method consistent with the present disclosure, various chips having different functions can be integrated into one packaging structure, thereby improving the integration of the fan-out packaging structure. By means of the first redistribution layer, the second redistribution layer, and the metal connecting post, three-dimensional vertical stacked packaging is achieved. In this way, the integration of the packaging structure can be effectively improved, and conduction paths can be effectively shortened, thereby reducing the power consumption of the subsequently prepared device, increasing its transmission speed, and data processing capacity.

BRIEF DESCRIPTION OF THE DRAWINGS

FIG. 21 is a schematic structural diagram of the final fan-out packaging structure according to the present disclosure.

DETAILED DESCRIPTION

Figure 1:
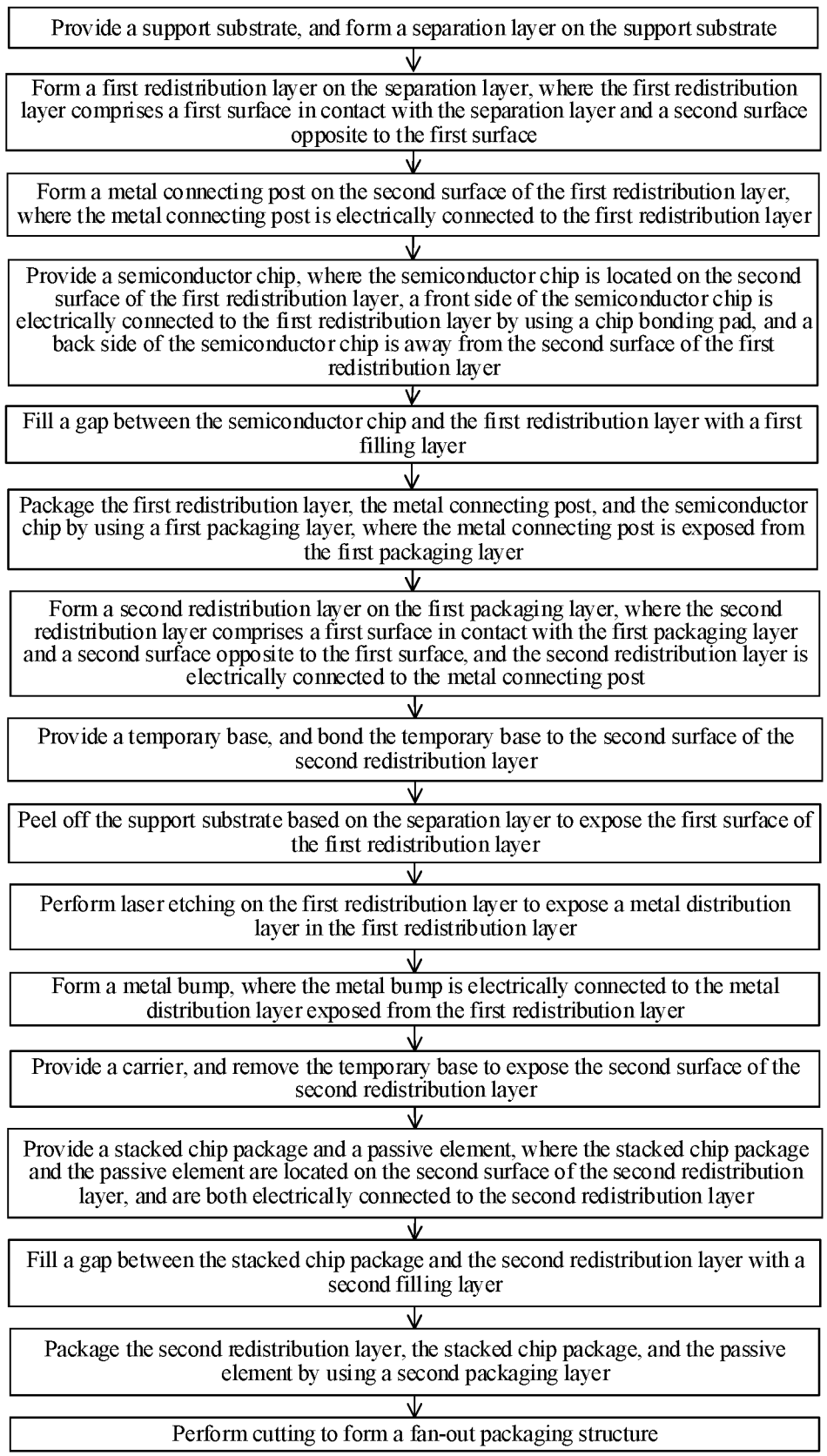
FIG. 1 is a flowchart showing a preparation process of a fan-out packaging structure according to the present disclosure.

The implementations of the present disclosure are described below through specific examples. Those skilled in the art can easily understand the other advantages and effects of the present disclosure from the content disclosed in this specification. The present disclosure may also be implemented or applied through other different specific implementations. Various details in this specification may also be modified or changed based on different viewpoints and applications without departing from the spirit of the present disclosure.

For example, when describing the embodiments of the present disclosure in detail, for ease of description, a cross-sectional view for showing a device structure is partially enlarged not necessarily to scale, and the schematic diagram is merely an example and is not intended to limit the scope of the present disclosure.

For ease of description, spatial terms, such as "under", "below", "lower", "beneath", "above", "upper", and the like, may be used herein to describe the relationship between one element or feature and another element or feature as shown in the accompanying drawings. It is to be understood that these spatial terms are intended to encompass other directions of the device in use or operation than the directions depicted in the accompanying drawings. In addition, when a layer is referred to as being "between" two layers, the layer may be the only layer between the two layers, or one or more layers may be present therebetween. As used herein, "between . . . and . . . " means that two endpoint values are included.

In the context of this application, a structure in which a first feature is described as being "on" a second feature may include an embodiment in which the first feature and the second feature are in direct contact with each other, or may include an embodiment in which there is another feature formed between the first feature and the second feature. In other words, the first feature and the second feature may not be in direct contact with each other.

It should be noted that, the drawings provided in this embodiment only exemplify the basic idea of the present disclosure. Although only the components related to the present disclosure are shown in the drawings, and they are not drawn according to the quantities, shapes, and sizes of the components during actual implementation. During actual implementation, the patterns, quantities, and proportions of the components may be changed as needed, and the layout of the components may be more complicated.

As shown in FIG. 1, this embodiment provides a fan-out packaging method. By means of this embodiment, various chips having different functions can be integrated into one packaged structure, thereby improving the integration of the fan-out packaging structure with the chip. By means of the first redistribution layer, the second redistribution layer, and the metal connecting post, the three-dimensional vertical stacked packaging is achieved. In this way, the integration level of the packaging structure can be effectively improved, in addition, the conduction path can be effectively shortened, thereby further reducing the power consumption, increasing the transmission speed, and increasing the data processing capacity.

Figure 2:
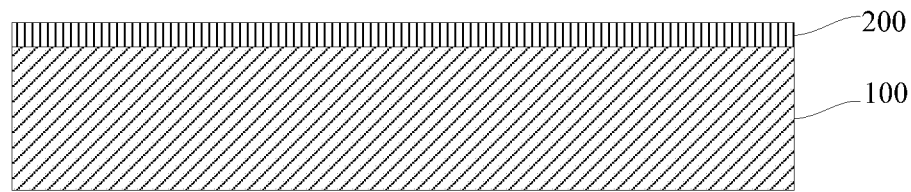
FIG. 2 to FIG. 21 are schematic structural diagrams showing steps in the preparation process of the fan-out packaging structure, according to the present disclosure, where

FIG. 2 to FIG. 21 show subsequent steps in the preparation process of the fan-out packaging structure. First, referring to FIG. 2, a support substrate 100 is provided, and a separation layer 200 is formed on the support substrate 100.

Accordingly, the support substrate 100 may comprise one of a glass substrate, a metal substrate, a semiconductor substrate, a polymer substrate, and a ceramic substrate. In this embodiment, the support substrate 100 is preferably a glass substrate, which is easier to work with at low cost. It is easy to form the separation layer 200 on a glass substrate, and also safe to perform the subsequent peeling process from the support glass substrate 100. The separation layer 200 may comprise one of an adhesive tape and a polymer layer. When a polymer layer is used, the surface of the support substrate 100 may be coated first with a polymer by a spin coating process, and then the polymer may be cured and shaped by an ultraviolet curing or heat curing process. In this embodiment, the separation layer 200 adopts a light-to-heat conversion (LTHC) layer, so that the LTHC layer can be heated by a laser in subsequent steps. In this way, the support substrate 100 can be separated from the LTHC layer, thereby rendering the peeling process easier to control and damage.

Figure 3:
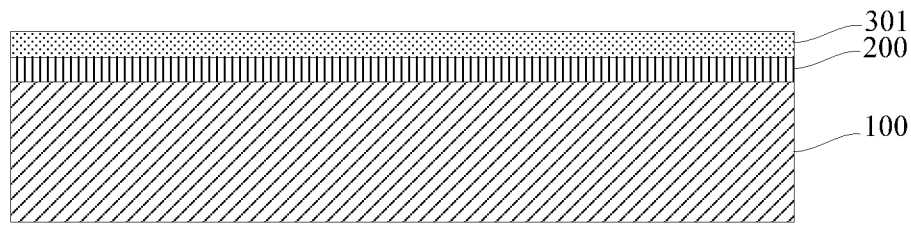
Figure 4:
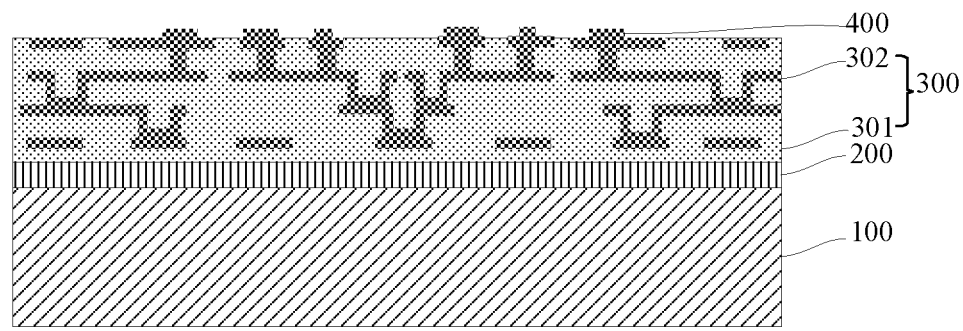

Next, referring to FIG. 3 and FIG. 4, a first redistribution layer 300 is formed on the separation layer 200. The first redistribution layer 300 comprises a first surface and a second surface, the first surface is in contact with the separation layer 200, and the second surface is opposite to the first surface.

As an example, in this embodiment, a dielectric layer 301 is first formed on a surface of the separation layer 200, and then a patterned metal distribution layer 302 is formed on the dielectric layer. In addition, the step of forming the dielectric layer 301 and then the metal distribution layer 302 can be alternately repeated according to process requirements, so as to form more dense conductive channels and reduce the thickness of the first redistribution layer 300. The specific number of internally stacked layers of the first redistribution layer 300 can be selected as required. A material of the dielectric layer 301 may be one of epoxy resin, silica gel, polyimides, polybenzoxazole, benzocyclobutene, silicon oxide, phosphosilicate glass, and fluorine-containing glass. A material of the metal distribution layer 302 may be one of copper, aluminum, nickel, gold, silver, and titanium.

As an example, after the first redistribution layer 300 is formed, the method further comprises a step of forming an under bump metal (UBM) layer 400 on the second surface of the first redistribution layer 300.

Specifically, the UBM layer 400 can strengthen the bonding between the subsequent semiconductor chip 600 and the first redistribution layer 300, and the material and preparation method of the UBM layer 400 are not limited herein.

Figure 5:
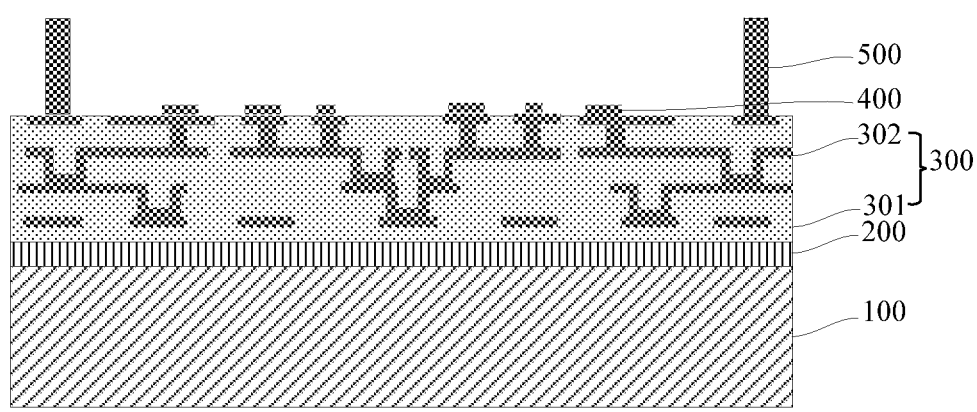

Next, referring to FIG. 5, metal connecting posts 500 are formed on the second surface of the first redistribution layer 300. The metal connecting posts 500 each is electrically connected to the relevant structures of the first redistribution layer 300.

For example, the metal connecting post 500 may be formed by a wire bonding process. The wire bonding process may comprise one of a thermo-compression wire bonding process, an ultrasonic wire bonding process, and a thermo-compression ultrasonic wire bonding process. A material of the metal connecting post 500 may comprise one or more of Au, Ag, Cu, and Al. The method for forming the metal connecting posts 500 and the selection of the material are not excessively limited herein.

Figure 6:
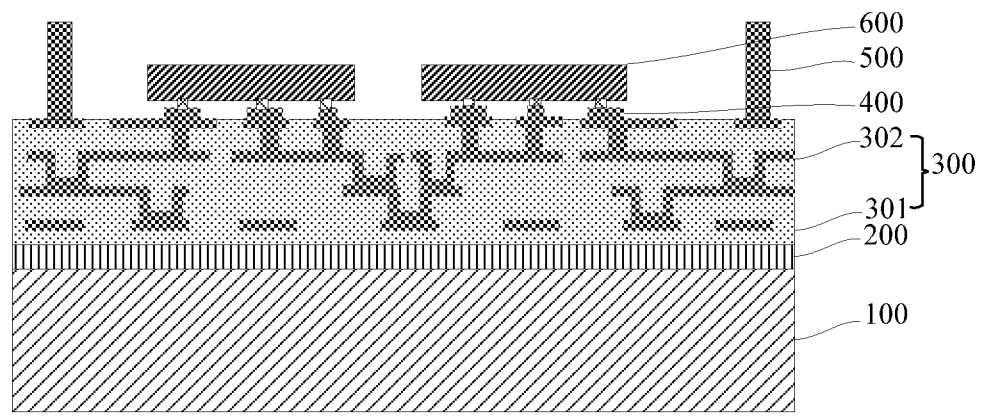

Next, referring to FIG. 6, a semiconductor chip 600 is provided. The semiconductor chip 600 is located on the second surface of the first redistribution layer 300. A front side of the semiconductor chip 600 is electrically connected to the first redistribution layer 300 by one or more chip bonding pads. A back side of the semiconductor chip 600 is facing away from the second surface of the first redistribution layer 300.

As an example, the height of one of the metal connecting posts 500 is greater than the thickness of the semiconductor chip 600.

Preferably, when the height of the metal connecting post 500 is greater than the height of the semiconductor chip 600, the chip is protected so damage to the semiconductor chip 600 can be reduced in the subsequent thinning process. Height of each metal connecting post 500 and the thickness of the semiconductor chip 600 may also be set according to the type of the semiconductor chip 600.

Figure 7:
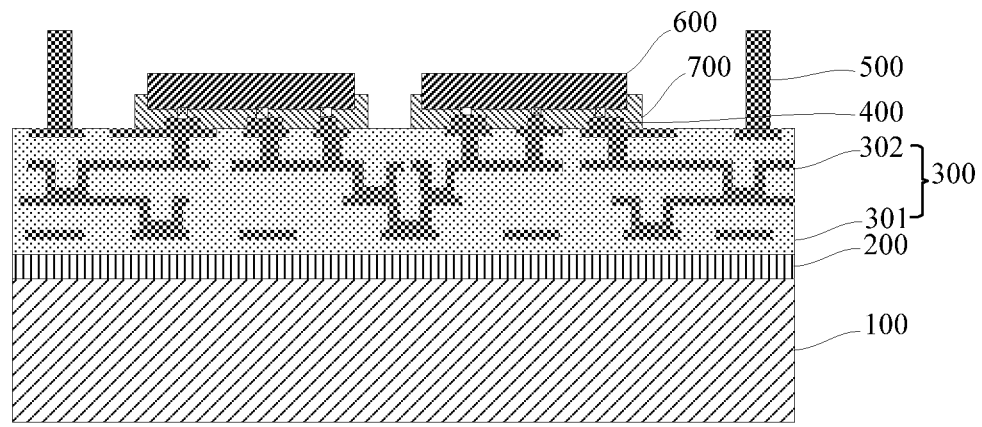

Next, referring to FIG. 7, there is a gap between the front side of the semiconductor chip 600 and the second surface of the first redistribution layer 300, and this gap is filled with a first filling layer 700.

As an example, the first filling layer 700 may comprise one of an epoxy resin layer, a polyimide layer, and a silica gel layer. In this way, the gap can be filled with the first insulating filling layer 700 to strengthen the bonding effect between the semiconductor chip 600 and the first redistribution layer 300, so as to form a protective layer, thereby preventing moisture and oxygen from impacting the semiconductor chip 600 and the first redistribution layer 300. The material of the first filling layer 700 is not limited herein.

Figure 8:
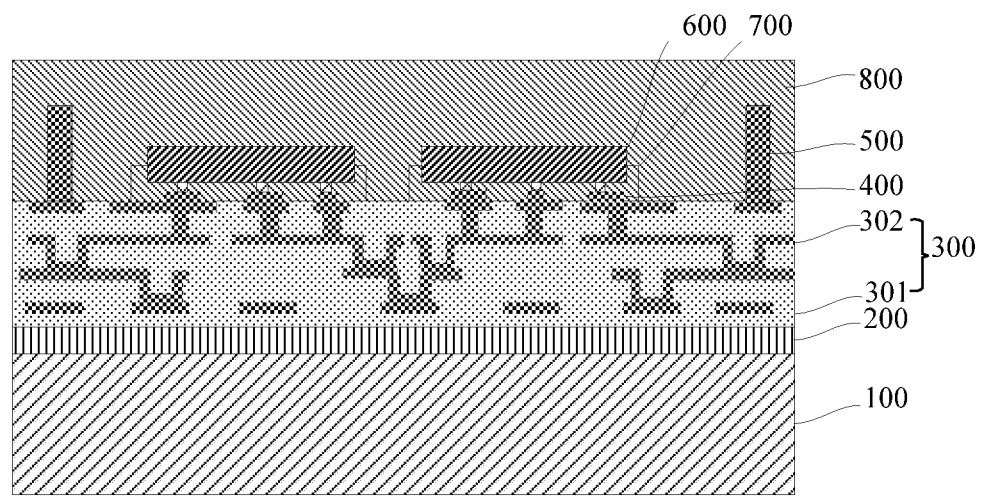
Figure 9:
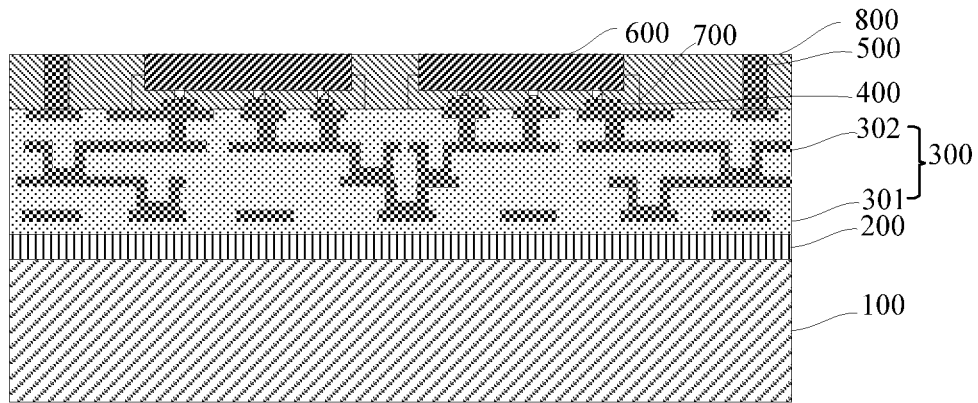

Next, referring to FIG. 8 and FIG. 9, the first redistribution layer 300, the metal connecting post 500, and the semiconductor chip 600 are packaged by a first packaging layer 800. The metal connecting posts 500 are exposed from the first packaging layer 800.

As an example, the method for forming the first packaging layer 800 may comprise one of compression molding, transfer molding, liquid sealing molding, vacuum lamination, and spin coating. The material of the first packaging layer 800 may comprise one of polyimide, silica gel, and epoxy resin. After the first packaging layer 800 is formed, the method may further comprise polishing or grinding a top surface of the first packaging layer 800, to provide a flat top surface of the first packaging layer 800 and to expose the top surfaces of the metal connecting posts 500 from the first packaging layer 800.

Figure 10:
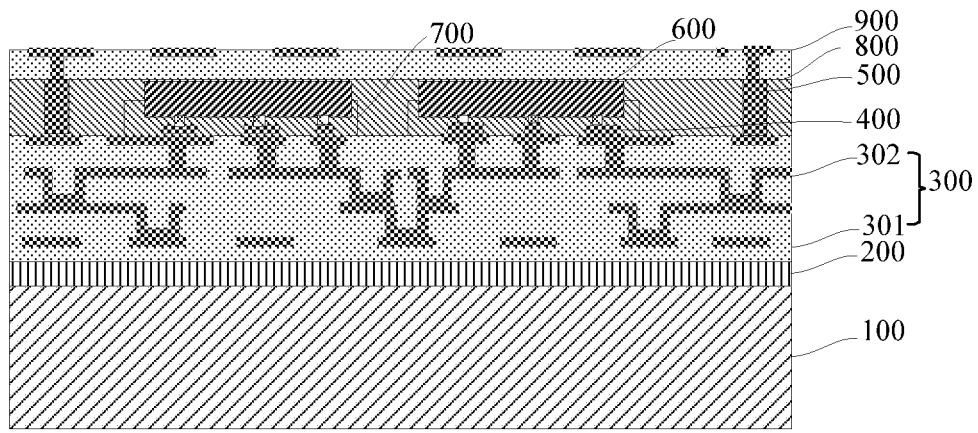

Next, referring to FIG. 10, a second redistribution layer 900 is formed on the first packaging layer 800. The second redistribution layer 900 comprises a first surface in contact with the first packaging layer 800 and a second surface opposite to the first surface, and the second redistribution layer 900 is electrically connected to the metal connecting posts 500.

As an example, a thickness of the first redistribution layer 300 is greater than a thickness of the second redistribution layer 900.

As an example, the material, structure, and preparation techniques of the second redistribution layer 900 are similar to those of the first redistribution layer 300. In this embodiment, since the first redistribution layer 300 has relatively more conductive channels, the thickness of the first redistribution layer 300 is typically greater than the thickness of the second redistribution layer 900. The specific sizes of the first redistribution layer 300 and the second redistribution layer 900 are not excessively limited herein.

Figure 11:
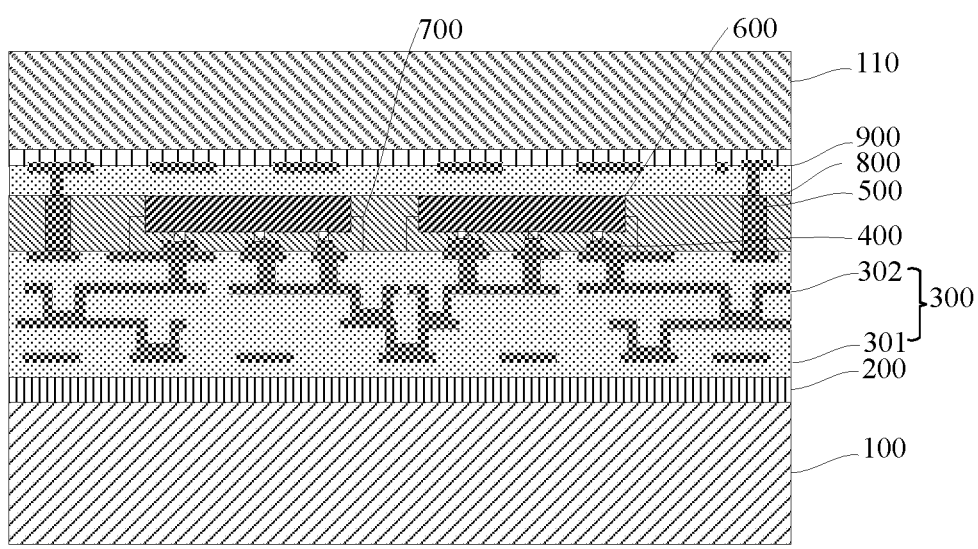

Next, referring to FIG. 11, a temporary base 110 is provided, and the temporary base 110 is bonded to the second surface of the second redistribution layer 900 to provide a temporary support in order to facilitate the peeling off of the support substrate 100 before performing any subsequent processes. For the material and the bonding method of the temporary base 110, refer to the description of the support substrate 100.

Figure 12:
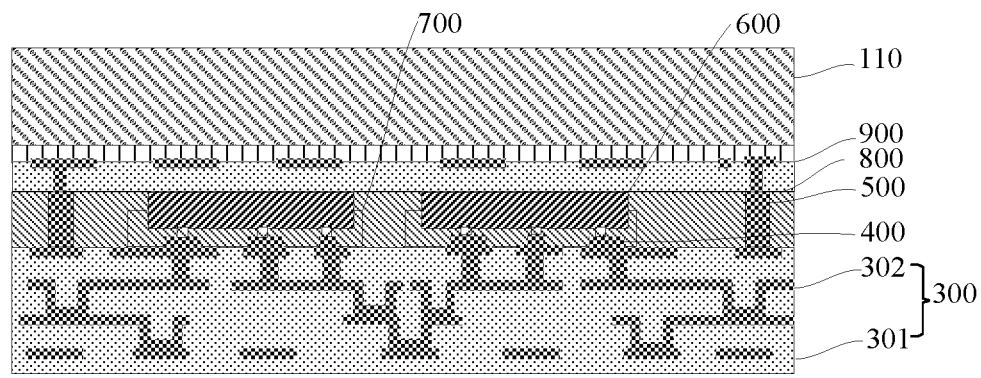

Next, referring to FIG. 12, the support substrate 100 is peeled off along with the separation layer 200 to expose the first surface of the first redistribution layer 300.

As an example, since the separation layer 200 adopts the LTHC layer in some embodiment, the support substrate 100 can be heated by a laser so it can be separated from the LTHC layer. However, the method of peeling off the support substrate 100 is not limited thereto, and may be adjusted according to the materials of the support substrate 100 and the separation layer 200.

Figure 13:
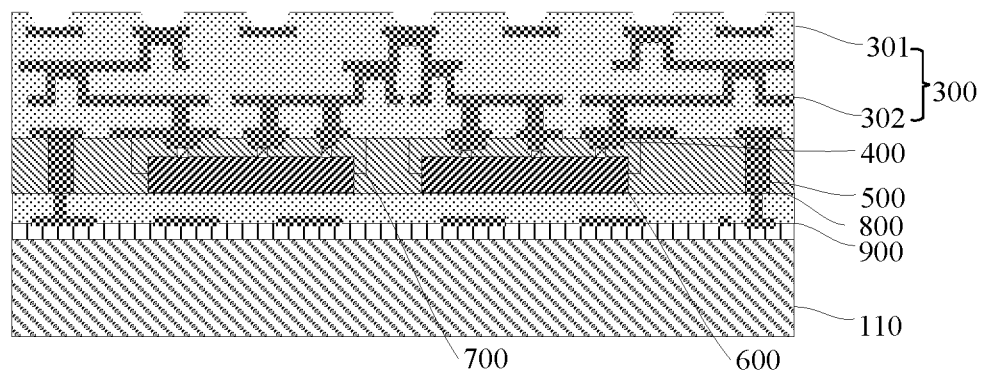

Next, referring to FIG. 13, laser etching is performed on the first redistribution layer 300 to expose the metal distribution layer 302 in the first redistribution layer 300.

Figure 14:
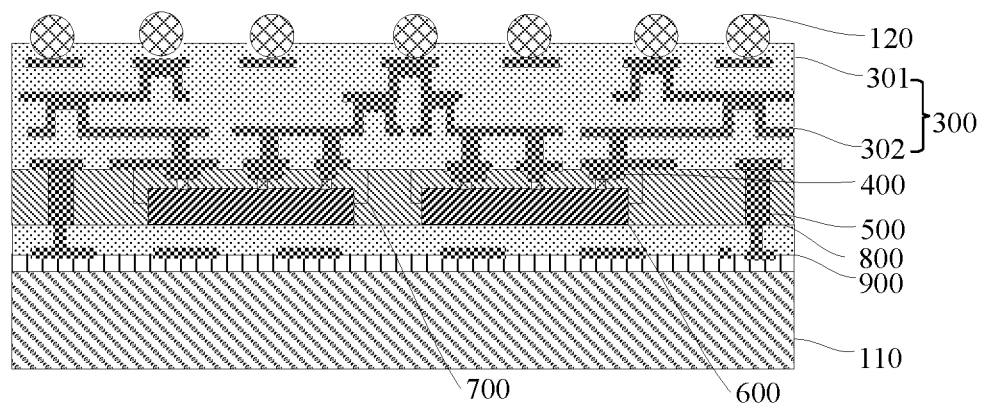

Next, referring to FIG. 14, metal bumps 120 are formed, and the metal bumps 120 are electrically connected to the metal distribution layer 302 which are exposed from the first redistribution layer 300. The metal bumps 120 may comprise copper bumps, nickel bumps, tin bumps, and silver bumps. The specific type of the metal bumps may be set as needed.

Figure 15:
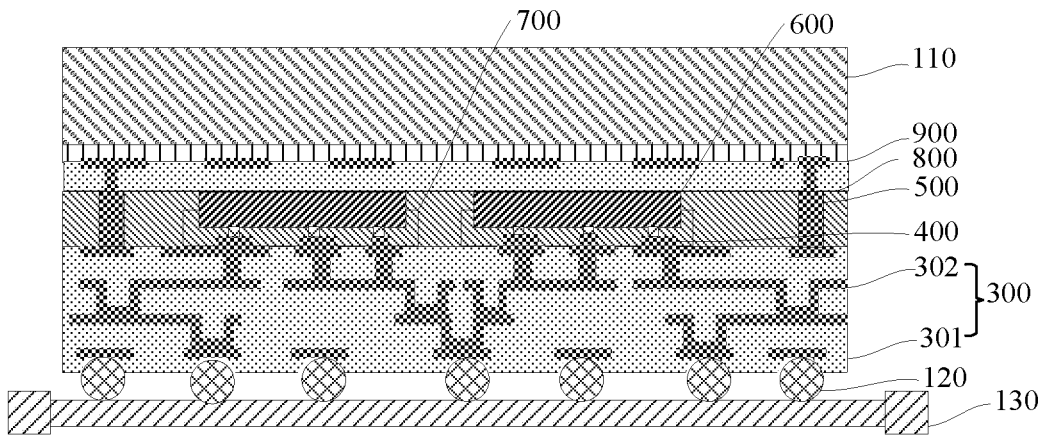
Figure 16:
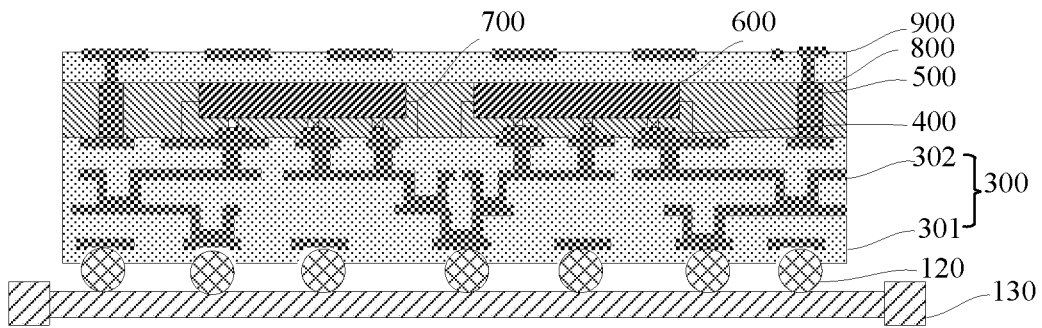

Next, referring to FIG. 15 and FIG. 16, a carrier 130 is provided, and the temporary base 110 is removed to expose the second surface of the second redistribution layer 900.

Figure 17:
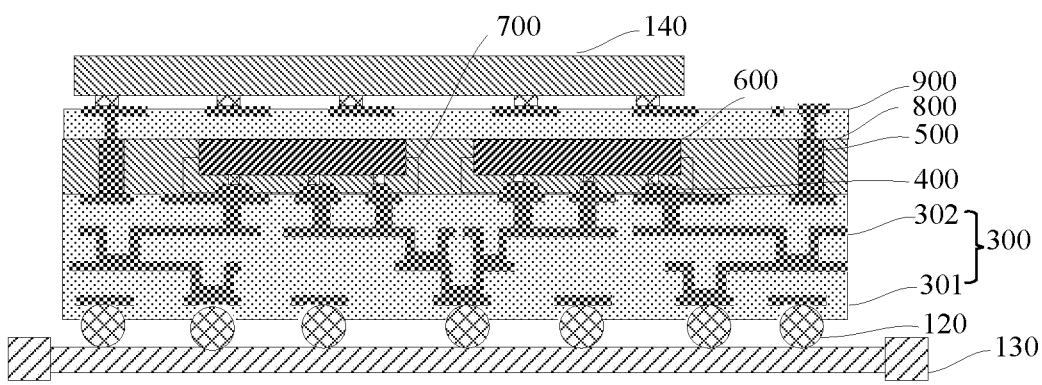
Figure 18:
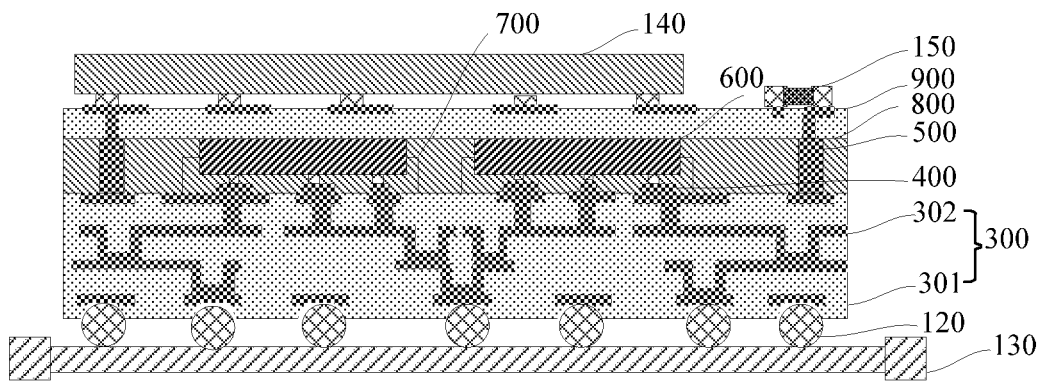

Next, referring to FIG. 17 and FIG. 18, a stacked chip package 140 and a passive element 150 are provided. The stacked chip package 140 and the passive element 150 are located on the second surface of the second redistribution layer 900, and are both electrically connected to the second redistribution layer 900.

As an example, the stacked chip package 140 comprises an embedded package on package (ePoP) memory.

As an example, the passive element 150 comprises one or more of a resistor, a capacitor, and an inductor.

Although as an example, in this embodiment, the stacked chip package 140 is an ePoP memory, but the present disclosure is not limited thereto. Other types of packages may also be used as required. Similarly, the passive element 150 may also be disposed as required, which is not excessively limited herein.

Figure 19:
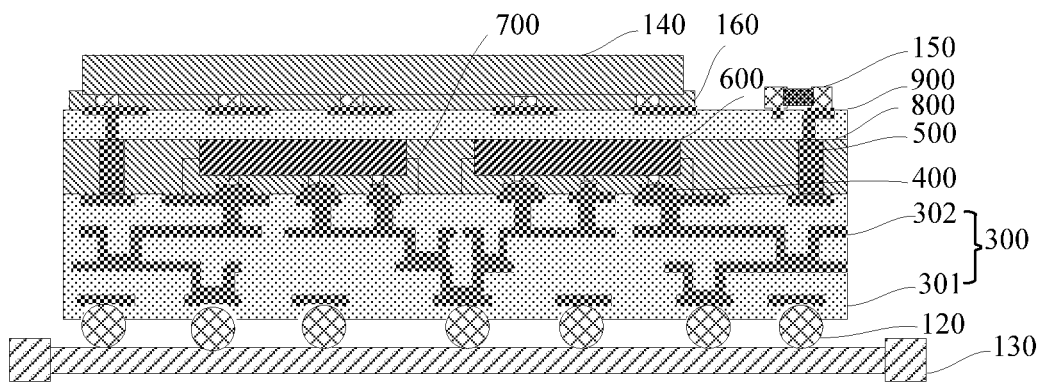

Next, referring to FIG. 19, there is a gap between the stacked chip package 140 and the second surface of the second redistribution layer 900, and the gap is filled with a second filling layer 160.

As an example, the second filling layer 160 may comprise one of an epoxy resin layer, a polyimide layer, and a silica gel layer. For the specific function of the second filling layer 160, refer to the first filling layer 700.

Figure 20:
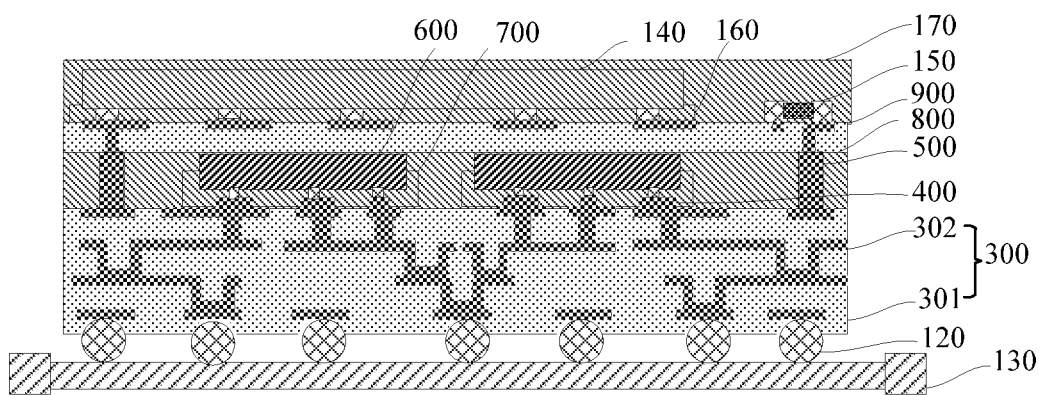

Next, referring to FIG. 20, the second redistribution layer 900, the stacked chip package 140, and the passive element 150 are further packaged by a second packaging layer 170.

As an example, the second packaging layer 170 comprises one of the epoxy resin layer, the polyimide layer, and the silica gel layer. For the exemplary method for preparing the second packaging layer, refer to descriptions above regarding to the first packaging layer 800.

Figure 21:
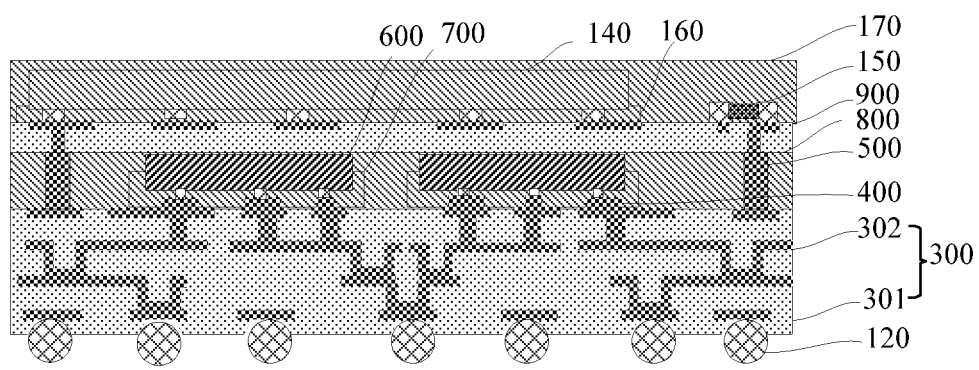

Finally, referring to FIG. 21, cutting is performed to form a fan-out packaging structure.

Referring to FIG. 21, another embodiment of the disclosure further provides a fan-out packaging structure. The fan-out packaging structure may be prepared by the foregoing preparation method, but the present disclosure is not limited thereto. In this embodiment, the fan-out packaging structure is prepared by the foregoing preparation method. Therefore, details of the preparation method and materials of the fan-out packaging structure will not be repeated herein.

As an example, the fan-out packaging structure comprises a first redistribution layer 300, a second redistribution layer 900, a metal connecting post 500, a semiconductor chip 600, a first filling layer 700, a first packaging layer 800, a stacked chip package 140, a passive element 150, a second filling layer 160, a second packaging layer 170, and metal bumps 120. The first redistribution layer 300 comprises a first surface and a second surface opposite to each other. The second redistribution layer 900 comprises a first surface and a second surface opposite to each other. The metal connecting post 500 is located between the second surface of the first redistribution layer 300 and the first surface of the second redistribution layer 900, and is electrically connected to the first redistribution layer 300 and the second redistribution layer 900. The semiconductor chip 600 is located between the second surface of the first redistribution layer 300 and the first surface of the second redistribution layer 900. A front side of the semiconductor chip 600 is electrically connected to the first redistribution layer 300 by a chip bonding pad, and a back side of the semiconductor chip 600 is away from the first redistribution layer 300. The first filling layer 700 is located between the semiconductor chip 600 and the first redistribution layer 300 and is configured to fill a gap between the semiconductor chip 600 and the first redistribution layer 300. The first packaging layer 800 is located between the second surface of the first redistribution layer 300 and the first surface of the second redistribution layer 900, and is configured to cover the first redistribution layer 300, the metal connecting post 500, and the semiconductor chip 600. The stacked chip package 140 and a passive element 150 are located on the second surface of the second redistribution layer 900 and are electrically connected to the second redistribution layer 900. The second filling layer 160 is located between the stacked chip package 140 and the second redistribution layer 900 and is configured to fill a gap between the stacked chip package 140 and the second redistribution layer 900. The second packaging layer 170 is configured to cover the second redistribution layer 900, the stacked chip package 140, and the passive element 150. The metal bumps 120 are located on the first surface of the first redistribution layer 300 and are electrically connected to the first redistribution layer 300.

As an example, the stacked chip package 140 comprises an ePoP memory.

As an example, the passive element 150 comprises one or more of a resistor, a capacitor, and an inductor.

As an example, the thickness of the first redistribution layer 300 is greater than the thickness of the second redistribution layer 900.

As an example, the first packaging layer 800 comprises one of an epoxy resin layer, a polyimide layer, and a silica gel layer. The second packaging layer 170 comprises one of an epoxy resin layer, a polyimide layer, and a silica gel layer. The first filling layer 700 comprises one of an epoxy resin layer, a polyimide layer, and a silica gel layer. The second filling layer 160 comprises one of an epoxy resin layer, a polyimide layer, and a silica gel layer.

As an example, the metal bumps 120 comprise one of copper bumps, a nickel bumps, tin bumps, and silver bumps.

Based on the above, by means of the fan-out packaging structure and the fan-out packaging method consistent with the present disclosure, various chips having different functions can be integrated into one packaging structure, thereby improving the integration of the fan-out packaging structure. By means of the first redistribution layer, the second redistribution layer, and the metal connecting post, three-dimensional vertical stacked packaging is achieved. In this way, the integration of the packaging structure can be effectively improved, and the conduction paths can be effectively shortened, thereby reducing the power consumption, increasing the transmission speed, and increasing the data processing capacity of the subsequently prepared device.

The above embodiments only exemplarily illustrate the principles and effects of the present disclosure, but are not used to limit the present disclosure. Any person skilled in the art may make modifications or changes on the foregoing embodiments without departing from the spirit and scope of the present disclosure. Therefore, all equivalent modifications or changes made by a person of ordinary skill in the art without departing from the spirit and technical idea of the present disclosure shall be covered by the claims of the present disclosure.

What is claimed is:

1. A method of making a fan-out packaging structure, comprising:
    providing a support substrate, and forming a separation layer on the support substrate;
    forming a first redistribution layer on the separation layer, wherein the first redistribution layer comprises a first surface in contact with the separation layer and a second surface opposite to the first surface;
    forming metal connecting posts on the second surface of the first redistribution layer, wherein the metal connecting posts are electrically connected to the first redistribution layer;
    providing a semiconductor chip, wherein the semiconductor chip is located on the second surface of the first redistribution layer, wherein a front side of the semiconductor chip is electrically connected to the first redistribution layer by chip bonding pads, and wherein a back side of the semiconductor chip is facing away from the second surface of the first redistribution layer;
    filling a gap between the semiconductor chip and the second surface of the first redistribution layer with a first filling layer;
    packaging the first redistribution layer, the metal connecting posts, and the semiconductor chip with a first packaging layer, wherein the metal connecting posts are exposed from the first packaging layer;
    forming a second redistribution layer on the first packaging layer, wherein the second redistribution layer comprises a first surface in contact with the first packaging layer and a second surface opposite to the first surface, and wherein the second redistribution layer is electrically connected to the metal connecting posts;
    providing a temporary base, and bonding the temporary base to the second surface of the second redistribution layer;
    peeling off the support substrate along with the separation layer to expose the first surface of the first redistribution layer;
    performing a laser etching on the first redistribution layer to expose a metal distribution layer in the first redistribution layer;
    forming metal bumps, wherein the metal bumps are electrically connected to the metal distribution layer exposed from the first redistribution layer;
    providing a carrier, wherein the metal bumps rest on the carrier;
    removing the temporary base to expose the second surface of the second redistribution layer;
    providing a stacked chip package and a passive element, wherein the stacked chip package and the passive element are located on the second surface of the second redistribution layer, and are both electrically connected to the second redistribution layer;
    filling a gap between the stacked chip package and the second redistribution layer with a second filling layer;
    packaging the second redistribution layer, the stacked chip package, and the passive element with a second packaging layer; removing the carrier; and
    performing cutting to form the fan-out packaging structure after removing the carrier.

2. The method of making the fan-out packaging structure as in claim 1, wherein the stacked chip package comprises an Embedded Package on Package (ePoP) memory.

3. The method of making the fan-out packaging structure as in claim 1, wherein the passive element comprises one or more of a resistor, a capacitor, and an inductor.

4. The method of making the fan-out packaging structure as in claim 1, wherein after the forming a first redistribution layer, the method further comprises a step of forming an under bump metallurgy (UBM) layer on the second surface of the first redistribution layer.

* * * * *